US010509426B2

(12) United States Patent
Ganesan et al.

(10) Patent No.: US 10,509,426 B2
(45) Date of Patent: Dec. 17, 2019

(54) METHODS AND CIRCUITS FOR CONTROLLING AND/OR REDUCING CURRENT LEAKAGE DURING A LOW-POWER OR INACTIVE MODE

(71) Applicant: Analog Devices Global Unlimited Company, Hamilton (BM)

(72) Inventors: Sriram Ganesan, Bangalore (IN); Amit Kumar Singh, Bangalore (IN); Nilanjan Pal, Kolkata (IN); Nitish Kuttan, Bangalore (IN)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 0 days.

(21) Appl. No.: 15/969,204

(22) Filed: May 2, 2018

(65) Prior Publication Data
US 2019/0339727 A1   Nov. 7, 2019

(51) Int. Cl.
*G05F 1/46* (2006.01)
*G01R 19/00* (2006.01)
*G11C 11/417* (2006.01)

(52) U.S. Cl.
CPC ........... *G05F 1/46* (2013.01); *G01R 19/0092* (2013.01); *G11C 11/417* (2013.01)

(58) Field of Classification Search
CPC ...... G05F 1/46; G01R 19/0092; G11C 11/417
USPC ....................................................... 365/226
See application file for complete search history.

(56) References Cited

U.S. PATENT DOCUMENTS

| 5,352,973 | A | 10/1994 | Audy |
| 5,781,481 | A | 7/1998 | Iwakiri |
| 10,034,336 | B1* | 7/2018 | Ye ....................... H05B 33/0818 |
| 10,079,584 | B1* | 9/2018 | Jing ..................... H03G 3/3084 |
| 2005/0253642 | A1 | 11/2005 | Chen |
| 2008/0170458 | A1 | 7/2008 | Haid et al. |
| 2009/0256616 | A1 | 10/2009 | Garrett |
| 2012/0188673 | A1* | 7/2012 | Teggatz ........... G01R 19/16552 361/64 |
| 2013/0293986 | A1 | 11/2013 | Lerner et al. |
| 2016/0241225 | A1 | 8/2016 | Ali |
| 2019/0033348 | A1* | 1/2019 | Zeleznik ................... H03F 1/26 |

OTHER PUBLICATIONS

Office Action issued in EP Patent Application Serial No. 19170463.4 dated Sep. 12, 2019, 11 pages.

\* cited by examiner

*Primary Examiner* — Fernando Hidalgo
(74) *Attorney, Agent, or Firm* — Patent Capital Group

(57) ABSTRACT

Methods, systems and circuits for controlling the power available to the load, by reducing the power available to the load, and additionally or alternatively, limiting the current available by pre-establishing a maximum reference current. The reference current is compared to the actual or estimated current drawn by the load or part of the load. The comparison result is used to control a device or switch which disconnects the power supply or power supply regulator, whether connected directly to the load or connected via voltage dropping device, to one or more or a plurality of the load blocks when the maximum current is exceeded.

20 Claims, 5 Drawing Sheets

METHODS AND CIRCUITS FOR CONTROLLING AND/OR REDUCING CURRENT LEAKAGE DURING A LOW-POWER OR INACTIVE MODE

TECHNICAL FIELD OF THE DISCLOSURE

The present disclosure relates to the field of power regulation in System-on-chip (SoC), microcontrollers, and similar systems, and in particular to power supply regulation during inactive or low-power operating modes.

BACKGROUND

Overview

The demand for increasingly smaller and flexible devices has long resulted in a preference for the space-saving practicality of volatile memory such as SRAM (static random-access memory). While SRAM memory is ubiquitous it is not without drawbacks. One such drawback is the high-power consumption and current leakage that can result from the active data retention which is necessary to retain any desired data in SRAM memory after the system enters a sleep or inactive mode. Data retention can advantageously reduce the awakening/response times of a system (or time to get the device back up to speed and working where it left off, as the latest data is readily available in the SRAM memory), but this comes at the cost of significant power consumption.

Data Retention and Current Leakage

Current demand during sleep mode can sometimes be higher than in normal operation. SRAM blocks continue to draw current from the (local) power regulator in order to maintain the latest recorded data status/values. The current drawn by an SRAM load during a sleep or low-power mode may sometimes be considered to be, or be referred to as, current leakage. If the current drawn by a load exceeds the capability of the power regulator, it risks regulator malfunction, which in turn may result in failure of other components supplied by the regulator. Moreover, the malfunction will also generally result in loss of SRAM or volatile data, and in particular that data which has not (additionally) been stored in a non-volatile medium such as flash memory. Examples of the types of data to be retained include but are not limited to, data related to healthcare applications such as data acquired during pulse or SPO2 monitoring, and ECG.

Temperature and Current Leakage

For various reasons, the problem of leakage currents intensifies with higher system/die temperatures. Leakage currents may create a compounding effect, such that the leakage current heats up system components and this in turn results in increased leakage current. Thus, leakage currents may become a significant hindrance to power efficiency, and they can negatively interfere with system (e.g. microcontroller) operation, particularly at higher temperatures as power is dissipated during operation.

Data Retention and Response/Awakening Times

Significantly minimizing or eliminating data retention is not generally an option, as retaining SRAM data is generally critical to achieve highly desirable faster device operation. Thus, a trade-off will generally have to be made between the amount of data that may be retained (and corresponding awakening times) and reliable power regulator operation.

This trade-off becomes a difficult challenge in the quest of providing real-time based applications (such as health care applications) with ever-increasing precision, and/or higher functionality, which translates to more complex circuitry with higher power consumption. In turn, device processing and/or response times become a highly critical performance factor. Thus, it becomes a challenge to provide reduced power consumption, while maintaining acceptable response times.

BRIEF SUMMARY OF THE DISCLOSURE

Thus, one of the objects of the embodiments of the disclosure to reduce and/or limit leakage current during a sleep or idle mode, while simultaneously achieving data retention. Low-power modes (and/or ultra-low-power modes) may range from a light sleep or standby mode, to deep-sleep modes and complete powering off, each consuming progressively lower levels of power. In hibernation modes or sleep/idle modes in particular, the power supply may be fully cut off from most components in the system (except for any critical components which require continuous power to maintain reliable operation). Various embodiments may be used to address power consumption in any of these operating modes, and the terms to describe low-power and/or ultra-low-power modes may be used interchangeably throughout this disclosure.

This is achieved by systems, circuits, and/or methods for reducing the power available to the load, and additionally or alternatively, limiting the current available to the load by establishing a maximum (reference) current, which is compared to the actual drawn current, and using this comparison to control a switch which disconnects the power supply or power supply regulator (whether connected directly to the load or connected via voltage drop) to one or more or a plurality of the load blocks when said maximum current is exceeded.

Some or all SRAM data may be retained when a device enters a sleep mode. Retaining data helps wake the device up faster as the retained data is readily available and doesn't have to be retrieved. However, retaining data usually demands significant current and causes temperature increase in the die, which in turn increases current demands/leakage thus creating a snowball effect. This can result in malfunctioning of the chip and may crash the on-chip regulator.

Various embodiments disclosed herein can help reduce temperature-associated current leakage and further it does so in a manner that expands the safe window of operation during sleep mode. In some embodiments it can additionally cut off the load from a power supply to prevent crashing of the on-chip power regulator.

A first circuit, or voltage dropping circuit, (in some cases, the first circuit can be referred to as dual voltage dropping element or a current sensor) implements a constant yet temperature-dependent voltage drop between the system power supply/regulator and the load in a system, so that the load sees a reduced power supply. The voltage drop is constant in relation to the current drawn by the load, yet remains dependent on temperature.

The voltage dropping circuit includes a feedback circuit for feedback mechanism) which serves to sample how much current is being drawn by the load, and the feedback circuit also drives a voltage drop device of the voltage dropping circuit as it provides its gate voltage (which due to the circuit configuration will be related to load demand).

Thus, the greater the load demand, the greater the sampled current and the greater the gate voltage provided to the voltage dropping device, which in turn increases the voltage drop, and which ultimately decreases the voltage available to the load. The voltage drop is kept substantially constant and will vary only with temperature variations.

The higher the temperature, the higher the voltage drop and thus it slows down the current leakage in the load, so that the current leakage problem is contained over a longer high-temperature span (current leakage increases with temperature and if the current demand is exceedingly high it may result in malfunction of the power regulator).

Thus, the first circuit effectively operates to reduce the power seen by the load and to increase the voltage drop as the temperature increases so that less current can be drawn by the load. The first circuit does not need to be limited to use during a low-power mode but may be used in regular operation as well.

As less voltage is provided to start with, the temperature creep associated with SRAM data holding occurs at a slower rate and thus it takes longer before temperature/current demands reach inoperability level (i.e. when regulator crashes and data is lost). The result is that the power consumption is reduced and effectively expands the temperature window of operation of the device/chip.

A second circuit, or a current limiting circuit, may be connected to the first circuit, performing the functions of current comparing and current limiting.

The second circuit operates to disconnect the load (or part of it) if a reference current is exceeded. The reference current may that which is the limit of safe operation of the power regulator.

This enhances safe operation and preserves integrity of the power supply regulator of the system incorporating this aspect of the disclosure.

Further variations and embodiments of the disclosure are described herein.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF THE DRAWINGS

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure are set forth in the proceeding in view of the drawings where applicable.

Various schemes, circuits, systems and methods are disclosed herein which, when implemented may advantageously provide various levels of controlled power consumption reduction.

It is noted that while several of the exemplary embodiments refer to a load which is an SRAM block or SRAM block group, the circuits and methods according to the disclosure may be used with other types of loads without departing from the scope of the disclosure.

Figure 1:
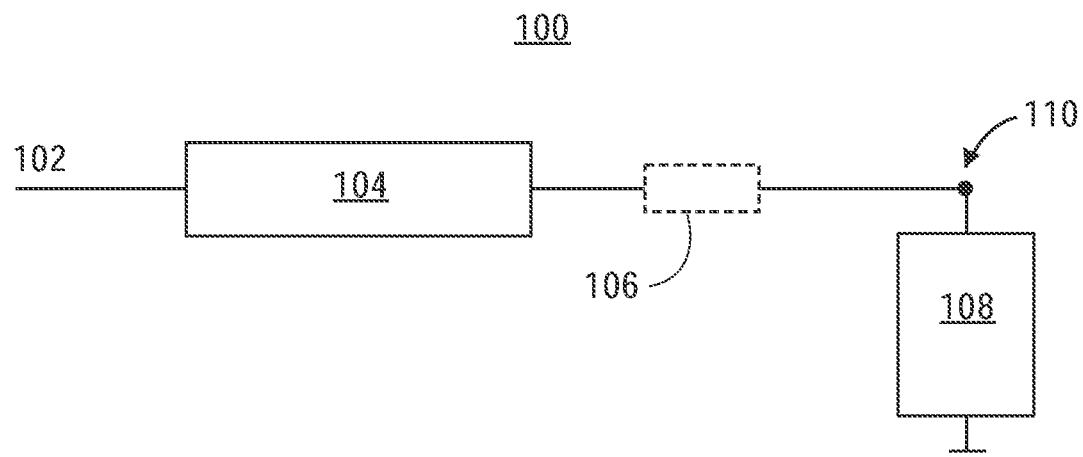
FIG. 1 is a schematic of a device comprising a voltage dropping circuit and a current limiting circuit according to some embodiments of the disclosure.

A block diagram according to an exemplary embodiment of the disclosure is shown in FIG. 1. A circuit 100 comprising a voltage dropping circuit 104 connected to an optional current limiting circuit 106. The voltage dropping element 104 is connected to a power supply 102. The power supply 102 may comprise a main power supply or alternatively a power supply regulator. A load 108 is connected to the voltage dropping circuit 104 and may additionally be connected to the current limiting circuit 106. The voltage dropping circuit 104 has the dual function of providing a voltage drop between the power supply 102 and a load 108, as well as sensing the current being drawn by the load 108. The current sensed or sampled by the voltage dropping circuit 104 may be alternatively referred to as the leakage current (i.e. the current being drawn by the load during an inactive or low-power mode). As the load 108 is connected to the power supply 102 via the voltage dropping element 104 it effectively sees a reduced power supply 110. The power supply 110 is configured to provide power equivalent to that of the power supply 102 minus the voltage drop provided by the voltage dropping circuit 104. The load 108 may comprise a memory block such as an SRAM block. The voltage dropping circuit 104 (providing current sensing function) samples the leakage current drawn by the load and a scaled copy of this leakage current may be used by the current limiting circuit block 106 to compare against a reference current to control the supply to the load. The reference current may be provided by a PTAT current source (a current source that is proportional to absolute temperature). Thus, this current is advantageously correlated to the system or die temperature such that the circuit is adapted accordingly.

Figure 2:
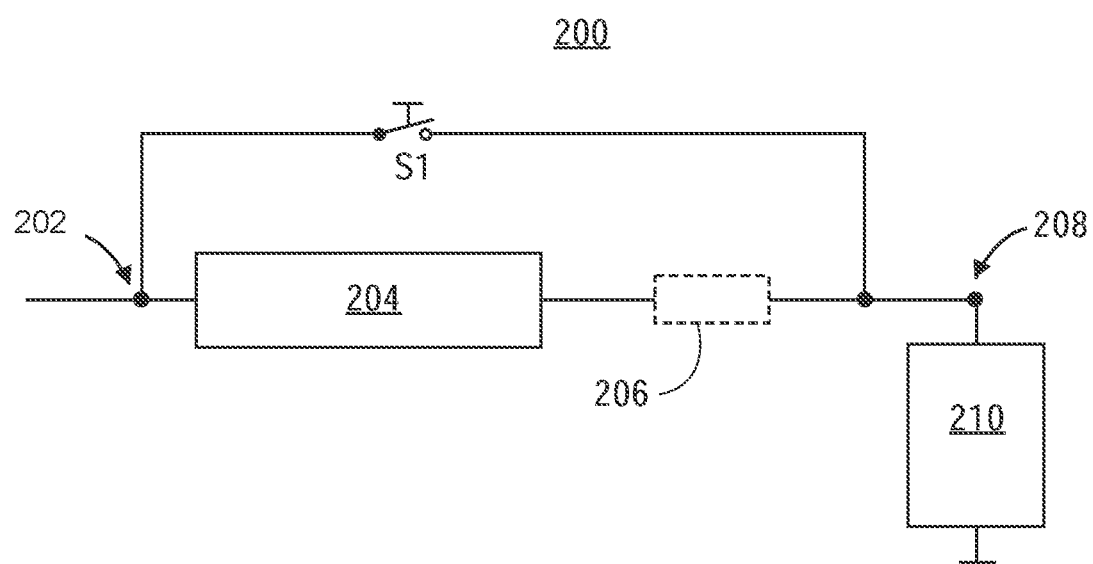
FIG. 2 is a schematic diagram of a device comprising a voltage dropping circuit, a current limiting circuit, and a bypass switch, according to some embodiments of the disclosure.

FIG. 2 illustrates a schematic circuit 200 in which the scheme shown in FIG. 1 may be deployed, according to a further embodiment of the disclosure. The schematic circuit 200 includes a power supply 202, a voltage dropping circuit 204, an optional current limiting circuit 206, a load 210, and a bypass switch S1 connecting power supply 202 and node 208. In this implementation, a bypass switch S1 controls the connections to the voltage dropping circuit 204 and current limiting circut 206, and may control them such that, for example, they are not actively connected during data read/write operations, and such that they only actively connected during a sleep or low-power mode. As indicated in reference to FIG. 1, the current limiting circuit 206 may be optional, and the schematic circuit 200 may alternatively be provided without the current limiting circuit 204. This scheme is primarily targeted towards controlling the leakage current when, e.g., an SRAM load is in data retention mode (inactive/low-power mode). Thus, during a data read/write operation (active mode), which typically involves higher current, the voltage dropping circuit 205 and the current limiting circuit 206 could be bypassed by the bypass switch S1.

Circuit Implementation

The circuit implementation may be divided into two parts, namely, the voltage dropping circuit and the current limiting circuit. The voltage dropping circuit plays the dual role of sensing the load (e.g. SRAM) leakage current as well as having a controlled voltage drop on the supply line for the load. A (scaled) copy of this current is then created using current mirrors which is compared to a (PTAT) current reference. Providing a scaled copy of the current as opposed to a non-scaled copy advantageously reduces the power consumption of the circuit.

In the exemplary circuit schematics, the P-type metal-oxide-semiconductor (PMOS) transistors are characterized by dimensions W (width) and L (length), while the m parameter denotes a (monolithic or fingered) transistor size, or alternatively a specific number of discrete transistors. Thus, the differences in the m parameter value in the various transistors can serve as an indicative reference of the size ratio between the transistors. It is noted that transistors may be implemented as discrete transistors and/or as monolithic or 'fingered transistors'. The transistor dimensions in the circuit schematics are given in micrometers (μm). The transistor dimensions and size/dimension relationships shown in the figures are merely exemplary and other dimensions and size ratios may be used without departing from the scope of the disclosure.

Figure 3:
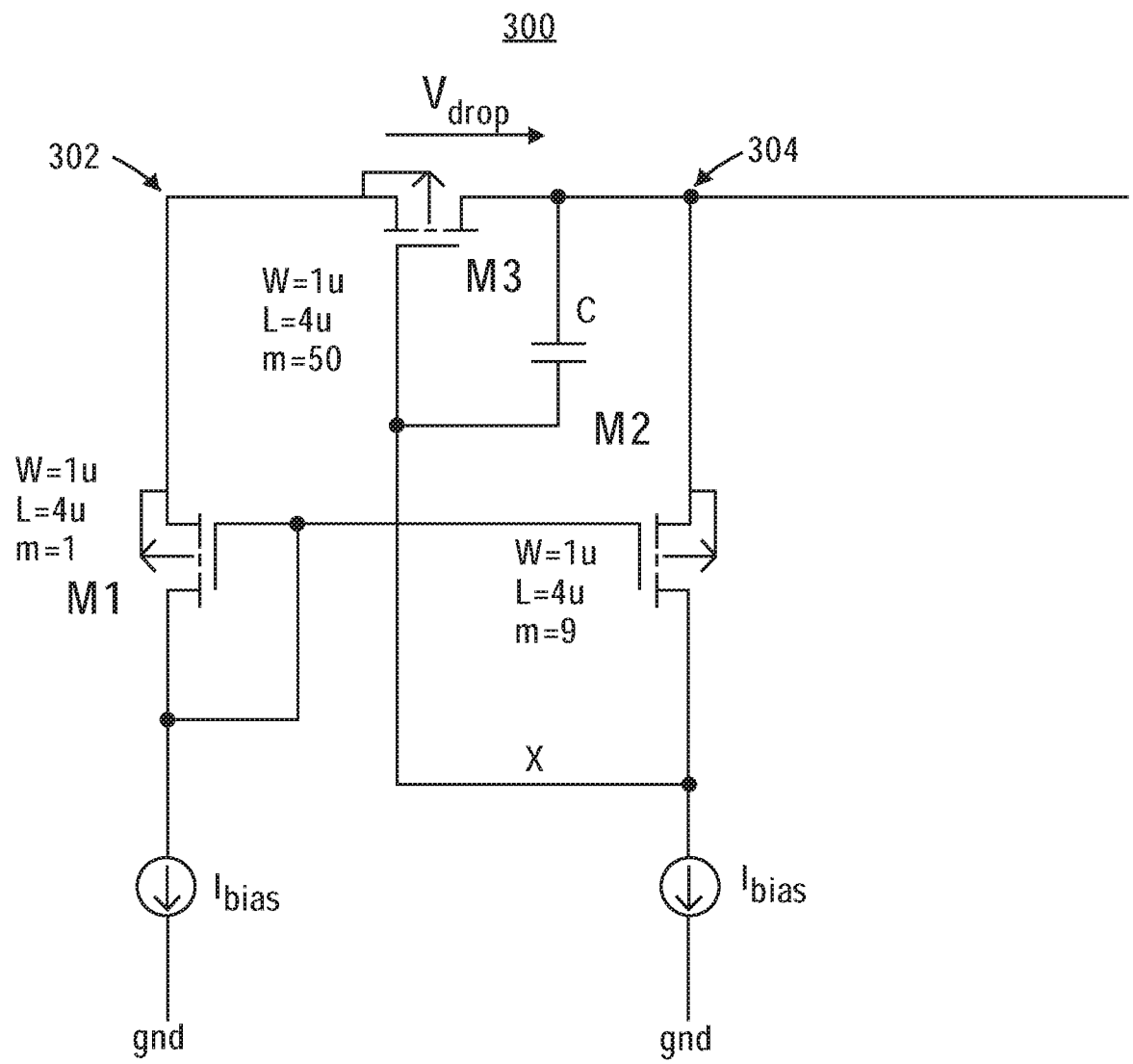
FIG. 3 is a schematic diagram of voltage dropping circuit according to some embodiments of the disclosure.

FIG. 3 shows a voltage dropping circuit 300 configured to provide a voltage drop and sense the leakage current drawn by a load during a low-power operation mode. This voltage dropping circuit not only produces a controlled voltage drop which is independent of the current flowing through, it also increases the voltage drop with increasing temperature (this may be the actual temperature seen by the circuit in, e.g., the silicon die). The two PMOS transistors M1 and M2 are biased in weak inversion with the same current value Ibias, but the size ratio between the M1 and M2 transistors yields a fixed but temperature-dependent voltage drop across the M3. A capacitor with a suitable capacitance C may be connected between the gate and drain of M3 for compensation purposes, in order to increase stability of the circuitry against frequency-induced effects. The capacitance C may be, for example, 10 pF. The node labeled as "x" denotes the driving voltage generated by the M1 and M2 pair, and which is provided to the gate of M3, and which results in the voltage drop provided across M3. The voltage drop to the power supply provided between the source and drain of M3 can be determined or approximated from the ratio of the sizes of M1 and M2 by using the equation: $V_{drop}=(kT/q)*\ln((W/L)M2/(W/L)M1)$, wherein k=Boltzmann Constant, T=Temperature in Kelvin, and q=electron charge. Exemplary transistor dimensions are shown in FIG. 3. All transistors M1, M2, and M3 show an exemplary W/L ratio of 1 to 4. A size ratio between M2 and M1 of 9 to 1 (as derived from the m parameter) is shown in FIG. 3. The greater the size ratio (that is, the greater the M2 transistor size relative to the M1 transistor size) the greater the voltage drop produced at M3. The M3 transistor may be significantly larger in terms of size, for example it may be implemented as fingered transistor with m=50. The voltage drop $V_{drop}$ across M3 takes the (regulated) supply voltage at node 302 down to a dropped supply at node 304.

Figure 4:
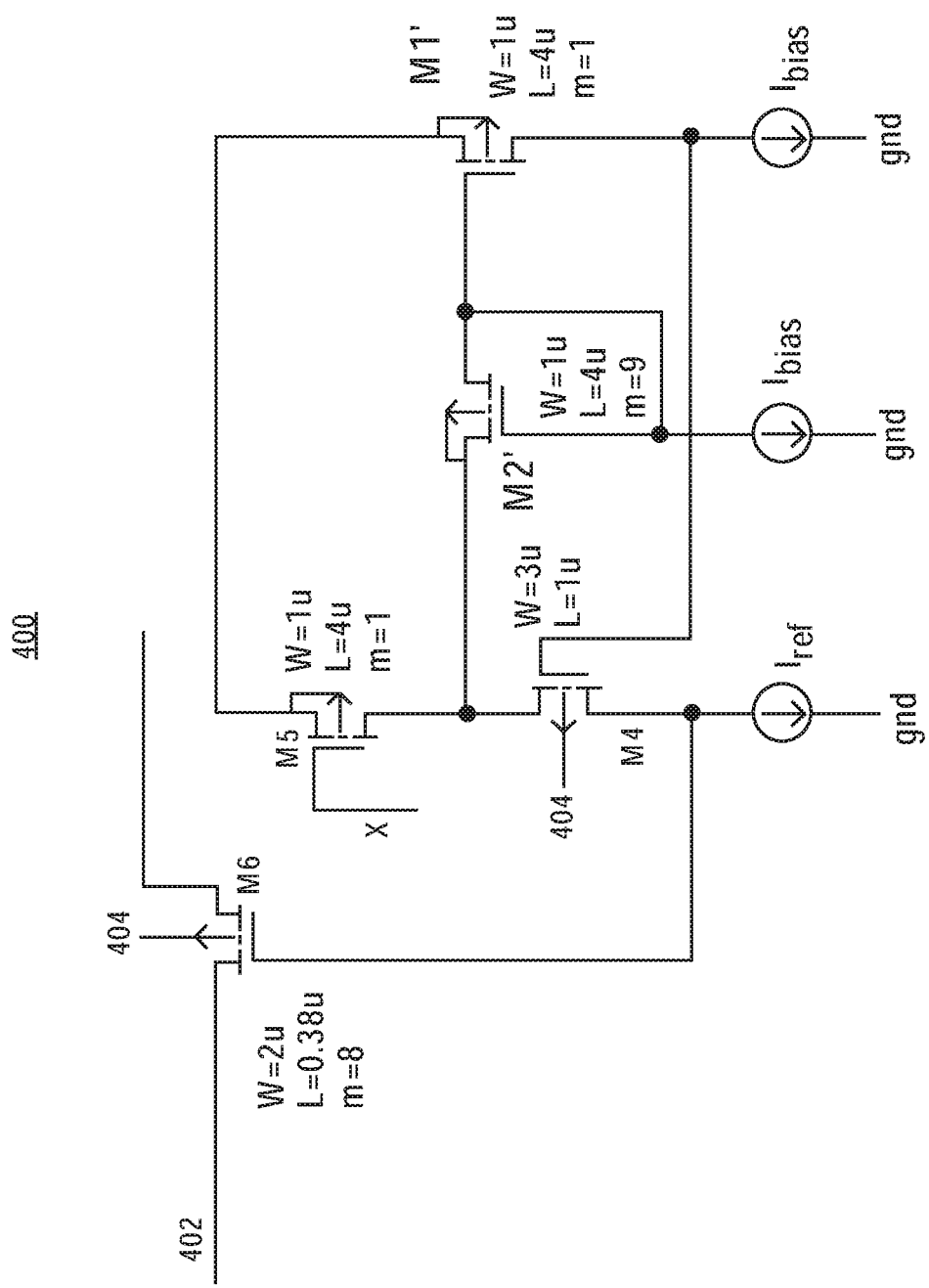
FIG. 4 is a schematic diagram of a voltage dropping element circuit and current limiting circuit according to some embodiments of the disclosure.

FIG. 4 shows a schematic of a current limiting circuit 400 which may be used to implement current limiting with a sufficiently accurate current copying circuit comprising a current copying device. In order to get a sufficiently accurate scaled copy of the current flowing through M3 (i.e., the SRAM leakage current), it is preferable to have the Vim voltage of the current copying device, e.g. current comprising transistor M5, matched properly. In order to achieve this, a similar circuit as shown in FIG. 3 may be replicated as shown in FIG. 4. Here, M1' and M2' form a $\Delta V_{GS}$ pair. This pair controls the Vim of the current copying transistor M5, which it will tend to maintain at a value similar to the value of Vim of M3 in FIG. 3. In this manner, the drain terminal of transistor M5 will output substantially the same current magnitude as that of the drain terminal of M3. This current will be effectively compared at the comparing circuit, comprising comparing transistor M4 to the reference current $I_{ref}$. The current limiting circuit may be implemented using a PMOS transistor M6 whose gate voltage is controlled by a current comparison point, which is provided by the comparing transistor M4. In this manner, the comparing transistor output controls M6, which effectively switches accordingly to disconnect the load (or part of it) from the (dropped) power supply 402 if its current demands, as reflected in the drain terminals of M3 and M5, exceed the reference current Iref. It is noted that in the examples shown in the figures the source terminals of M1, M1', M3 and M5 are connected to the main (non-dropped) power supply 404 (e.g., they may be connected directly to an on-chip power regulator).

The node labeled as "x" provides the gate voltage for the current copying device. With this arrangement, a highly accurate and scaled version of the leakage current may be obtained. This current is compared against a (preferably PTAT) reference current to control the supply to the load (e.g. SRAM bank) through the PMOS transistor M6. As the leakage current crosses or exceeds a pre-determined threshold, the PMOS transistor starts turning off, thereby decreasing the load supply voltage and shutting off the corresponding load block to prevent excessive loading of the regulator. While a single switch is shown in FIG. 4, a plurality of switches may be used to respectively control and (dis) connect a plurality of load blocks. In the case of an SRAM load comprising one or more banks, the contents in the disconnected SRAM bank will be lost when there is excessive current leakage, such an arrangement ensures other circuitry working under the low-power regulator, such as an RTC (Real-Time Clock), are protected. Alternatively, the current leakage may be sensed globally (i.e. the total load current leakage) and this measurement may be used with an assumption that the current is distributed substantially equally across the load or SRAM blocks. In this implementation, the system may also accordingly decide which switch to turn OFF (thus depriving the respective cutoff load of power).

The current limiting circuit according to this example has a forward voltage drop of less than 100 mV. At room temperature, this voltage drop on supply helps in reducing the leakage current itself. The quiescent current may be about 30 nA at room temperature. This scheme also advantageously provides flexible options regarding the detection of data loss and prioritization of the load blocks (SRAM banks). The gate of the current limiting switch holds the information regarding which bank or block has failed, which information may be stored and/or communicated to the system software or controller in the event of data loss. The value of the current limit/maximum can be adjusted from bank to bank thus giving protection preference to banks which, e.g., hold more important data in the event of unusual increase in leakage current.

Figure 5:
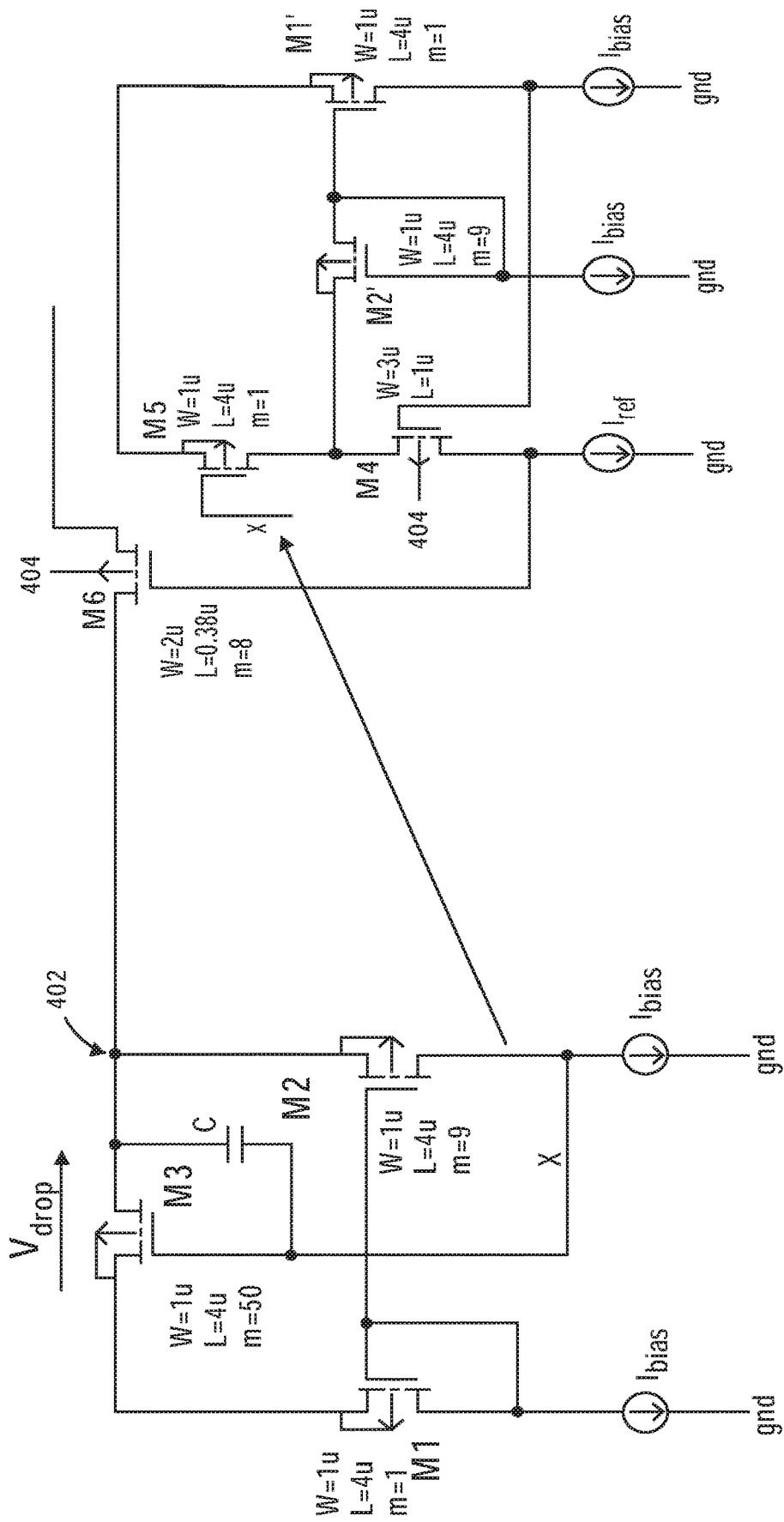
FIG. 5 is schematic diagram of a circuit comprising a voltage dropping circuit and a current limiting circuit according to some embodiments of the disclosure.

FIG. 5 shows a circuit combining the circuits shown in FIGS. 3 and 4, which are described above in reference to said figures.

Figure 6:
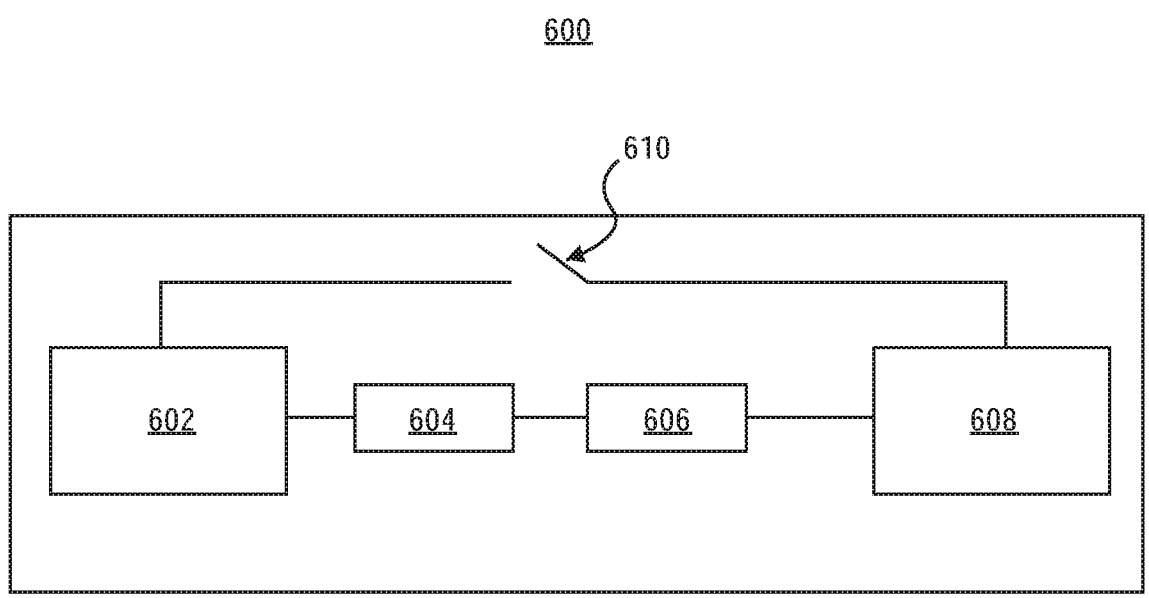
FIG. 6 is a schematic diagram of a system according to some embodiments of the disclosure.

FIG. 6 shows a schematic of a system according to some exemplary embodiments of the disclosure. A system (e.g. microcontroller) 600 includes voltage dropping circuit 604 (which acts both to sense current and provide a voltage drop) and additionally may include a current limiting circuit 606. The voltage dropping circuit 604 and current limiting circuit 606 may be bypassed by using a bypass switch 610 connected between a power supply (or regulator) 602 in the system and a load 608. The bypass switch 610 may be configured such that the voltage dropping circuit 604 and current limiting circuit 606 may be bypassed when the system is not in a sleep or low-power mode, and such that the voltage dropping circuit 604 and current limiting circuit 606 may be actively connected between the power supply (regulator) during active operations such as data read/write operations. The current limiting circuit 606 may be optional, and in some embodiments the system is only provided with a voltage dropping circuit 604, which may be connected via a bypass switch 610 between the (regulated) power supply 602 and load 608 in order to provide a voltage drop (which in turn decreases the power available to the load).

The voltage drop or voltage reduction as provided according to the disclosure may increase with temperature so that as the temperature increases less current is available to the load. This effectively counteracts the (undesirable) temperature effect and expands the temperature window of integral SRAM data retention and the effective good sleep/idle mode temporal duration.

The techniques disclosed herein thus provide an effect that is advantageously temperature-dependent. At higher temperatures, the current limiting circuit may switch off the current supply (once and if the current drawn by the load exceeds the established reference current). This advantageously preserves the integrity of other (more critical) blocks such as the RTC (real-time clock). While at lower temperatures the techniques reduce energy consumption by virtue of the reduced potential provided to the load.

While several power reduction and power limiting techniques are disclosed herein, the various techniques need not be used in conjunction and may each be implemented separately while still achieving advantageous power savings and efficient data retention, and further expanding the temperature window of operation of the system.

However, combining some of the techniques may offer an advantageous synergistic effect.

Moreover, the embodiments disclosed herein advantageously meet tight constraints on the quiescent current required to implement the techniques in hibernation mode. It is noted that the terms sleep mode, idle mode, inactive mode, hibernation mode, and low-power mode may be used interchangeably throughout the disclosure.

In some embodiments, a circuit for reducing and limiting current drawn by the load from a power supply is provided, the circuit comprising a voltage dropping circuit and a current limiting circuit, wherein the voltage dropping circuit comprises a voltage dropping device for providing a controlled voltage drop with a magnitude $V_{drop}$ and a dropped power supply output between a power supply and a load, and a feedback circuit connected the between an output terminal and an input terminal of the voltage dropping device, wherein the feedback circuit is configured to provide a driving voltage to the input of the voltage dropping device. In this manner, a substantially fixed yet controllable voltage drop is achieved. The use of a feedback loop ensures that the generated $V_{drop}$ voltage drop is almost completely independent of current.

In some embodiments, the circuit further comprises a current limiting circuit, which is configured to limit the current that is available to the load. Thus, the current limiting circuit comprises a load switch for connecting and disconnecting a power supply to a load, and further comprises a reference current source for providing a reference current for comparison. The reference current may be chosen to satisfy the power efficiency needs of (or preferences for) the system. In an exemplary application, it is desired to retain 100% of SRAM data, for example, 128 kB of data (in SRAM blocks), a current comparing circuit (or device) for comparing the sensed current output to the reference current thereby providing a comparison output signal, a current copying circuit (or device) configured to provide a scaled copy signal of a current drawn by a load connected between the dropped supply output an input to the load switch to the current comparing circuit (or device), wherein the load switch is controlled by the comparison output signal of the current comparing circuit (or device) such that it disconnects the power supply from the load if the sensed current exceeds the reference current.

In some embodiments, the voltage dropping circuit comprises one or more PMOS transistors M3 connected in parallel (like terminal connected to like terminal), wherein the M3 drain terminal is configured to sense a current drawn by a load, and wherein the feedback circuit comprises at least one first PMOS transistor M1 and at least one second PMOS transistor M2, wherein the source terminal of M1 is connected to the source terminal of M3, wherein the gate terminal of M1 is connected to the gate terminal of M2, the drain terminal of M2 is connected to the gate terminal of M3, and the gate terminal of M1 is also connected to the drain terminal of M1, wherein the gate voltage of M3 is at least partly determined by the sizing ratio between M1 and M2, and wherein the voltage drop magnitude $V_{drop}$ is mathematically approximated as $(kT/q)*\ln((W/L)M2/(W/L)M1)$.

PMOS transistors generally comprise a gate, drain, and source terminals, any of which may provide an input or output terminal and/or signal.

In some embodiments, the size ratio between the M2 and M1 transistors is at least 9 to 1. This will result in an effective voltage drop value. However, other M2 to M1 size ratios may be used without departing from the scope of the disclosure. For example, the M2 to M1 size ratio may be lower than 9 to 1, or it may be greater than 9 to 1.

The transistor and the size ratio between them may be implemented as separate devices or alternatively may be implemented as 'fingered transistors'.

In some embodiments, the current copying circuit (or device) comprises a PMOS transistor M5 whose gate terminal is connected to the gate terminal of M3 and a pair of PMOS transistors M1' and M2'.

In some embodiments the load switch comprises a single PMOS transistor M6. Alternatively, the switch may comprise one or more parallel-connected PMOS transistors configured to act as a single switch or as independently acting switches.

In some embodiments, the gate terminal of M1' is connected to the gate terminal of M2' and the drain terminal of M2'. The gate terminal of M2' and the drain terminal of M1' are connected to respective bias current sources. The gate terminal of M2' is connected to the drain terminal of M2'. The source terminal of M2' is connected to the drain terminal of M5. The current comparing circuit comprises a PMOS transistor M4. The gate of M4 is connected to a power supply. The drain of M4 is connected to a PTAT reference current source. The source terminal of M4 is connected to the source terminal of M2'. The drain terminal of M1' is connected to the gate terminal of M4. The drain terminal of M4 is connected to the gate terminal of M6. A PTAT reference current source is a current source that proportional to absolute temperature. Thus, the current source advantageously correlates to the system or die temperature such that the circuit is adapted accordingly.

In some embodiments, at least one capacitor with a capacitance C is connected between the drain and gate terminals of M3.

According to some embodiments, a system is provided which comprises the voltage dropping circuit as well as the current limiting circuit, and further comprising a power supply and a load, wherein the voltage dropping circuit and the current limiting circuit are connected between the power supply and the load. The system may be, for example, a microcontroller, field-programmable gate array (FPGA), SoC, or an embedded system. The power supply may be an on-chip power regulator. The current limiting circuit enhances safe operation and preserves the integrity of the power supply regulator of a system incorporating such a current limiting circuit.

Alternatively, the system may be provided with only the voltage dropping circuit. This advantageously enables a simpler and less costly implementation of a system while still benefitting from lower power consumption. In such embodiments the system may be provided with a bypass switch for selectively connecting the voltage dropping circuit between a (regulated) power supply and load. For example, the voltage dropping circuit may be bypassed during active times or during a data/read write operation, and may be connected during a sleep mode.

According to some embodiments, a system is provided which comprises the voltage dropping circuit as well as the current limiting circuit, and further comprising a power supply and a load, wherein the voltage dropping circuit and the current limiting circuit is connected between the power supply and the load. The current limiting circuit enhances safe operation of the system and preserves the integrity of the power supply regulator of the system.

In some embodiments, the voltage dropping circuit comprises one or more PMOS transistors M3 connected in parallel. The M3 drain terminal is configured to sense a current drawn by a load. The feedback circuit comprises at least one first PMOS transistor M1 and at least one second PMOS transistor M2. The source terminal of M1 is connected to the source terminal of M3. The gate terminal of M1 is connected to the gate terminal of M2. The drain terminal of M2 is connected to the gate terminal of M3. The gate terminal of M1 is also connected to the drain terminal of M1. The gate voltage of M3 is at least partly determined by the sizing ratio between M1 and M2; such that the voltage drop magnitude $V_{drop}$ is mathematically approximated as $(kT/q)*\ln((W/L)M2/(W/L)M1)$, wherein k=Boltzmann Constant, T=Temperature in Kelvin, and q=electron charge, in view of the PMOS transistor arrangements and their size proportions. The sizing relationship (size ratio) between M1 and M2 may be adjusted to provide a substantially pre-determined voltage drop to suit the requirements of a particular application. As can be inferred from the voltage drop mathematical approximation, the voltage drop is dependent on temperature. This advantageously results in a voltage drop that increases with temperature, such that current leakage is contained (reduced) throughout a longer temperature span thus expanding the effective temperature window of operation of the system.

In some embodiments, the current copying circuit (or device) comprises a PMOS transistor M5 whose gate terminal is connected to the gate terminal of M3, and a pair of PMOS transistors M1' and M2'. The load switch comprises a PMOS transistor M6. The gate terminal of M1' is connected to the gate terminal of M2' and the drain terminal of M2'. The gate terminal of M2' and the drain terminal of M1' are connected to respective bias current sources. The gate terminal of M2' is connected to the drain terminal of M2'. The source terminal of M2' is connected to the drain terminal of M5. The current comparing circuit comprises a PMOS transistor M4. The gate of M4 is connected to a power supply. The drain of M4 is connected to a PTAT reference current source. The source terminal of M4 is connected to the source terminal of M2'. The drain terminal of M1' is connected to the gate terminal of M4. The drain terminal of M4 is connected to the gate terminal of M6. The drain terminals of M1, M2, M1', and M2' are each connected to a respective bias current source Ibias. The PTAT reference current source and the bias current source are connected to an electrical ground reference. The drain terminal of M6 connected to the load and the source terminal of M6 is connected to the drain terminal of M3. The bias current source is preferably set in order to induce weak inversion operation in the transistors, which advantageously reduces their power consumption.

In some embodiments, a bypass switch connected between the power supply and the load, the bypass switch being configured such that the voltage dropping circuit and current limiting circuit are only actively connected (functional) between the power supply and the load during at least one of a hibernation mode, a sleep mode, a deep-sleep mode, an idle mode, a power-saving mode, or a standby mode, such that when they are not connected the voltage dropping circuit and current limiting circuit are bypassed by the system. The bypass switch may be configured so that it disconnects the voltage dropping circuit and current limiting circuit during e.g. read/write operations, and to connect those circuits back once the system enters a sleep or idle mode.

The bypass switch may be implemented using one or more semiconductor elements. For example, one or more PMOS transistors parallel connected between the dropped supply and the load may be configured to act as a bypass switch.

Alternatively or additionally a timer-based implementation could be used to trigger the low-power or ultra low-power (ULP) modes.

In some embodiments, the bias current source is configured to induce weak inversion operation in M1, M2, M1', and M2'. This advantageously reduces the power consumption of the transistors.

In some embodiments, the load comprises one or more memory blocks or one or more memory block groups, wherein each memory block or each memory block group is individually connected to the current limiting circuit, and wherein a switch in the current limiting circuit is configured to disconnect a memory block or a memory block group if the load current drawn by the respective memory block or memory block group exceeds the reference current. Thus, each load be individually disconnected or activated deactivated via the switch. Thus, each load may be provided with an independent, dedicated switch. The current leakage may be sensed separately for each load (e.g. for each memory block).

In some embodiments, the memory comprises one or more SRAM blocks or one or more SRAM block groups, wherein each SRAM block or each SRAM block group is individually connected to the current limiting circuit, and wherein the switch in the current limiting circuit is configured to disconnect an SRAM block or an SRAM block group if the load current drawn by the respective SRAM block or SRAM block group exceeds the reference current. Thus, each load be individually disconnected or activated deactivated via the switch. Thus, each load may be provided with an independent, dedicated switch. The current leakage may be sensed separately for each load (e.g. for each SRAM block).

Alternatively, the current leakage may be sensed globally (i.e., the total load current leakage), and this measurement may be used with an assumption that the current is distributed substantially equally across the load or SRAM blocks. In this implementation, the system may also accordingly decide which switch to turn OFF (thus depriving the cutoff load of power). Additionally, this decision may be based on a rank of importance or criticality of the loads or SRAM blocks, such that some loads are disconnected before others. In some embodiments, some blocks or loads may never be disconnected.

In some embodiments, at least one capacitor with a capacitance C is connected between the drain and gate terminals of M3 (other than any inherent or intrinsic parasitic capacitance of the transistor). Since this is part of a feedback circuit, it is advantageous to ensure that it is stable across frequency. That is, the circuit should not start oscillating by picking up some noise. The capacitor thus acts as a Miller capacitor and aids in "pole splitting". The capacitance C of the capacitor may, for example, be 10 pF (pico-Farads).

In some embodiments, the power supply is an on-chip power regulator. In some embodiments the power regulator may be, for example, a buck converter.

In some embodiments, M3 is configured to provide a voltage drop with a magnitude between 80-90 mV.

In some embodiments, the PMOS transistors are configured for a 3.3 nA current flow and are sized so that there is a drop of 100 MV across the voltage drop element. This advantageously leads to lower power consumption of the circuit.

In some embodiments, a method is provided for controlling the power supplied to one or more loads by a power supply, the method comprising the steps of reducing the power available to the one or more loads during a low-power operation mode (such as a hibernation, idle and/or sleep mode, or alternatively an ultra-low-power mode ULP) and limiting or disconnecting a load if it exceeds the power a current drawn/leakage threshold during a low-power operation mode. Thus, the step of controlling may comprise (inter alia) reducing and/or limiting the current available to (or alternatively consumed by) the load. The power supply may comprise a power regulator output as provided in a system such as a System-on-chip (SoC) microcontroller, FPGA or similar devices.

The method may further comprise the step of comparing a drawn current to a pre-established reference or threshold current in order to determine if the threshold has been exceeded. The current drawn by each separate load may be sensed and/or measured and compared to the threshold value. Accordingly, each load may be independently or separately disconnected from the power supply (or regulated power supply) in the case that its current demands exceed the pre-established threshold.

In some embodiments, a non-transitory computer-readable medium is provided comprising instructions which when executed in a processor configure the processor to carry out the steps of activating, during a low-power operation mode of a system, at least one of a voltage dropping device configured to reduce the power provided by a power supply to a load in the system and a current limiting device configured to limit current drawn by the load from the power supply in the system.

This improves the operation of the processor and system (e.g. microcontroller) wherein it is implemented and executed, because it results in energy/power savings and further expands the temperature window of operation of the processor or microcontroller during a low or ultra-low-power mode. The computer-readable medium may further comprise instructions which when executed configure the processor to receive or obtain information about a load exceeding current demands and further cause it to disconnect one more loads accordingly. The system may be a microcontroller or SoC, or FPGA, application-specific integrated circuit (ASIC), or any other similar device.

Moreover, the information about which part of the load was disconnected may be (temporarily) stored, and this information may be provided to a controller or other device.

The way to reduce current drawn by the relevant or respective block is by providing a voltage post regulator that is lower than the voltage provided during active or normal or non-low-power mode operation.

The effect of this lowered voltage on the block components is that the amount of current the block can pull will be less than when in active operation with higher voltage. The ratio or proportion of lowered current can be described as percentage of the normally pulled current.

In some embodiments, the input to the source of M2 is the feedback signal which may be a fraction of the output current from M3 (i.e. a scaled current). Using a scaled current in the current copying device advantageously reduces the power consumption of the circuit. The voltage at the source of M2 can be defined or approximated as Vsupply−voltage drop (M3 $V_DS$ voltage) and is fixed. M3 then produces the input for the gate (x) of the voltage drop transistor M3.

According to some embodiments, if necessary, the transistor bulk and source are connected. In the case of PMOS devices, this is easy to do as n-well can simply be tied off to the source. This is not done where it is not necessary in order to save board area, as tying off n-wells like this creates multiple n-well islands and there may be certain spacing requirements to be met in the board layout.

In some embodiments, the M3 and M6 transistors operate in linear region. For accurate current mirroring in the current copying device, devices would normally have to be biased well in saturation region, but we cannot do that here since the voltage drop would have to be kept large. But since ensuring both $V_{GS}$ and Vim voltages of these two devices are well matched, we are able to mirror the current accurately even though they are not in saturation.

Advantageously, all circuits according to the disclosure may be manufactured using standard complementary metal-oxide semiconductor CMOS) processes.

In some embodiments, PMOS transistors are biased by a bias current (or configured to be biased) to operate in the weak inversion region. This advantageously leads to reduced power needs.

In some embodiments, two bypass switches are provided, a first bypass switch for bypassing both the voltage dropping circuit and the current limiting circuit, and a second, separate bypass switch exclusively for the current limiting circuit. In this manner, an individual SRAM block's current leakage variation with voltage may be advantageously monitored.

In some embodiments, the circuits are implemented using alternative semiconductor technology. For example, in some embodiments the voltage dropping circuit and current limiting circuit are implemented with N-type metal-oxide semiconductor (NMOS) transistors. In such embodiments, the transistor should be connected the ground network as opposed to the supply network. Furthermore, dimensioning considerations should be taken into account in order to achieve similar levels of voltage drop and current limiting.

All circuits disclosed herein may be implemented using semiconductor technology different from the semiconductor technology of the exemplary embodiments, without departing from the scope of the disclosure. Such semiconductor technology may include, but is not limited to, bipolar-junction transistors (BJT) and field-effect transistors (FET).

According to a further embodiment of the disclosure, non-transitory computer-readable media are provided, comprising instructions which when executed carry out one or more of the methods disclosed herein.

In some embodiments, the computer-readable media may further comprise instructions with cause a processor or device to emit an alert signal that a (particular) memory block or group of memory blocks has failed or data has been lost. The failure may be due to deliberate disconnection of the load from the power supply. The alert may include information identifying the specific block or group of blocks which has failed. This advantageously allows the system to account for the possible loss of data. Additionally, the specific failing memory block or group of memory blocks may be identified, such that the system may advantageously take any appropriate action based on such identification. In this manner, system functionality is improved.

Variations and Implementations

The present disclosure encompasses apparatuses which can perform the various methods described herein. Such apparatuses can include circuitry illustrated by the FIGURES and described herein. Parts of various apparatuses can include electronic circuitry to perform the functions described herein. In some cases, one or more parts of the apparatus can be provided by a processor specially configured for carrying out the functions described herein (e.g., control-related functions, timing-related functions). The processor may include one or more application-specific components, or may include programmable logic gates which are configured to carry out the functions describe herein. In some instances, the processor may be configured to carrying out the functions described herein by executing one or more instructions stored on one or more non-transitory computer media.

In another example embodiment, the components of the FIGURES may be implemented as stand-alone modules (e.g., a device with associated components and circuitry configured to perform a specific application or function) or implemented as plug-in modules into application-specific hardware of electronic devices. Note that particular embodiments of the present disclosure may be readily included in a system on-chip (SoC) package, either in part, or in whole. An SoC represents an Integrated Circuit (IC) that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the error calibration functionalities may be implemented in one or more silicon cores in ASICs, FPGAs, and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or examples described herein. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or examples described herein. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions described herein illustrate only some of the possible functions that may be executed by, or within, systems/circuits illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or examples described herein. Note that all optional features of the apparatus described above may also be implemented with respect to the method or process described herein and specifics in the examples may be used anywhere in one or more embodiments.

What is claimed is:

1. A circuit for reducing current drawn by a load from a power supply, the circuit comprising:
   a voltage dropping circuit to provide a controlled voltage drop between the power supply and the load; and
   a feedback circuit, connected to an output terminal and an input terminal of the voltage dropping circuit, to provide a driving voltage to the input terminal of the voltage dropping circuit;
   a current comparing circuit to output a comparison output signal based on comparison of a scaled copy of a current through the voltage dropping circuit and a reference current; and
   a load switch between the output terminal of the voltage dropping circuit and the load, wherein the load switch is controlled by the comparison output signal.

2. The circuit according to claim 1, further comprising:
   a reference current source to provide the reference current; and
   a current copying circuit to generate the scaled copy of the current through the voltage dropping circuit;
   wherein the comparison output signal of the current comparing circuit disconnects the load from the output terminal of the voltage dropping circuit in response to the scaled copy of the current exceeding the reference current.

3. The circuit according to claim 2, wherein:
   the voltage dropping circuit comprises a first transistor;
   the feedback circuit comprises a second transistor and a third transistor; and
   a gate voltage of the first transistor is at least partly determined by a size ratio between the second transistor and the third transistor.

4. The circuit according to claim 3, wherein:
   the current copying circuit comprises: a fourth transistor whose gate is connected to a gate of first transistor, a fifth transistor, and a sixth transistor;
   the current comparing circuit comprises an eighth transistor to generate the comparison output signal at a drain of the eighth transistor; and
   the load switch comprises a seventh transistor whose gate is driven by the comparison output signal.

5. The circuit according to claim 3, further comprising at least one capacitor connected between a drain and gate of the first transistor.

6. A system comprising:
   a power supply;
   a load; and
   a circuit connected between said power supply and said load, the circuit comprising:
      a voltage drop transistor coupled to the power supply;
      a feedback circuit comprising a pair of transistors to generate a driving voltage to a gate of the voltage drop transistor based on a current drawn by the load;
      a current copying circuit to generate a scaled copy of the current drawn by the load; and
      a load switch to disconnect the load from the voltage drop transistor in response to the scaled copy of the current drawn by the load exceeding a reference current.

7. The system according to claim 6, wherein the circuit further comprises:
   a current comparing transistor to compare the scaled copy of the current drawn by the load and the reference current, and to generate a comparison control signal, wherein the load switch is responsive to the comparison control signal.

8. The system according to claim 6, wherein:
   a voltage drop across the voltage drop transistor is at least partly determined by a size ratio between the pair of transistors.

9. The system according to claim 6, wherein the current copying circuit comprises:
   a copying transistor; and
   a further pair of transistors to provide a further driving voltage to drive a gate of the copying transistor and maintain a drain to source voltage across the copying transistor that is the same as a drain to source voltage across the voltage drop transistor.

10. The system comprising to claim 7, wherein a drain of the current comparing transistor is to generate the comparison control signal, and the drain of the current comparing transistor is connected to the reference current and a gate of the voltage drop transistor.

11. The system according to claim 6, wherein the system further comprises:
   a bypass switch connected between the power supply and the load, the bypass switch being configured such that the circuit is only actively connected between the power supply and the load during at least one of a low-power mode, an ultra-low-power mode, a hibernation mode, a sleep mode, a deep-sleep mode, an idle mode, a power-saving mode, and a standby mode.

12. The system according to claim 9, wherein the pair of transistor and the further pair of transistors are biased by respective bias current sources.

13. The system according to claim 6, wherein:
   the load is one of a plurality of memory blocks or memory block groups, and
   other memory blocks or memory block groups are connected to the power supply via a respective circuit to disconnect the respective memory block or memory block group in response to a respective load current drawn by the respective memory block or memory block group exceeding a respective reference current.

14. The system according to claim 6, further comprising at least one capacitor connected between a drain and gate of the voltage dropping transistor.

15. The system according to claim 6, wherein the reference current is provided by a proportional-to-absolute temperature (PTAT) current source.

16. The system according to claim 6, wherein the power supply is an on-chip power regulator.

17. The system of claim 6, wherein the system is any one of a microcontroller, a field-programmable gate array (FPGA), a System-on-chip (SoC), an application-specific integrated circuit (ASIC), or an embedded system.

18. The system according to claim 6, wherein the voltage drop transistor is to provide a voltage drop with a magnitude between 80-90 millivolts.

19. A method for controlling power supplied to a load by a power supply in a system, the method comprising:
   reducing the power available to the load, during a low-power operation mode of the system by:
      providing a controlled voltage drop, by a voltage dropping circuit, between the power supply and the load and outputting a dropped voltage supply, wherein the controlled voltage drop is independent of a current drawn by the load;
      generating, by a current limiting circuit, a scaled copy of the current drawn by the load;
      comparing, by the current limiting circuit, the scaled copy of the current drawn by the load against a reference current provided by a proportional-to-absolute temperature (PTAT) current source; and disconnecting, by the current limiting circuit, the load from the dropped power supply in response to the scaled copy of current drawn by the load exceeding a the reference current.

20. The method of claim 19, further comprising:

bypassing the voltage dropping circuit and the current limiting circuit during an active operation mode of the system.

\* \* \* \* \*